United States Patent [19]

Honda et al.

[11] Patent Number: 5,315,399
[45] Date of Patent: May 24, 1994

[54] CAPACITIVE CIRCUIT

[75] Inventors: Fumiaki Honda, Takatsuki; Nobukazu Hosoya, Nara, both of Japan

[73] Assignee: Sanyo Electric Co., Ltd., Moriguchi, Japan

[21] Appl. No.: 904,066

[22] Filed: Jun. 26, 1992

[30] Foreign Application Priority Data

| Jun. 28, 1991 | [JP] | Japan | 3-158980 |
| Jun. 28, 1991 | [JP] | Japan | 3-158981 |
| Jun. 28, 1991 | [JP] | Japan | 3-158982 |
| Feb. 28, 1992 | [JP] | Japan | 4-043866 |

[51] Int. Cl.⁵ .................. H04N 5/60; H04N 5/00
[52] U.S. Cl. .................. 358/335; 333/213; 330/260
[58] Field of Search .................. 330/7, 260; 333/213–216; H04N 5/00, 5/60

[56] References Cited

U.S. PATENT DOCUMENTS

| 4,257,006 | 3/1981 | Schaumann | 333/213 |
| 4,551,683 | 11/1985 | Matsuo et al. | 333/213 X |
| 4,587,500 | 5/1986 | Tanaka et al. | 333/214 |
| 4,638,265 | 1/1987 | Lunn et al. | 333/214 |
| 4,748,422 | 5/1988 | Matsumoto et al. | 330/260 X |
| 4,994,756 | 2/1991 | Brilka | 330/260 |
| 4,999,584 | 3/1991 | Eskelinen | 330/260 |
| 5,012,201 | 4/1991 | Morita et al. | 333/214 X |

FOREIGN PATENT DOCUMENTS

WO81/02819  10/1981  World Int. Prop. O.

OTHER PUBLICATIONS

*Elektor Electronics,* vol. 13, No. 149, pp. 54–55 (Oct. 1987).
European Search Report.

*Primary Examiner*—Mark R. Powell
*Attorney, Agent, or Firm*—Armstrong, Westerman, Hattori, McLeland & Naughton

[57] ABSTRACT

A capacitive circuit incorporated in an integrated circuit, the capacitive circuit including a high-pass type non-inverting amplifier which receives an input signal and a differential amplifier which receives the input signal and an output signal of the non-inverting amplifier. A differential component between both signals is detected by the differential amplifier and fed-back to the input signal, the input impedance having a capacitive characteristic because the input signal is phase-shifted by 90 degrees.

12 Claims, 7 Drawing Sheets

CAPACITIVE CIRCUIT

BACKGROUND OF THE INVENTION

1. Field of the Invention

The present invention relates to a capacitive circuit. More specifically, the present invention relates to a novel capacitive circuit capable of forming an equivalent capacitor having a relatively large capacitance value in an integrated circuit.

2. Description of the Prior Art

In a conventional integrated circuit, an equivalent capacitor is formed by utilizing a PN junction.

In such a prior art, although it is possible to change a capacitance value by changing a voltage applied to the PN junction; however, the capacitance value was normally small and a variable range thereof was also narrow.

SUMMARY OF THE INVENTION

Therefore, a principal of the present invention is to provide a novel capacitive circuit.

Another object of the present invention is to provide a capacitive circuit capable of forming an equivalent capacitor having a relatively large capacitance value in an integrated circuit.

Another object of the present invention is to provide a capacitive circuit capable of forming an equivalent capacitor having a wider variable range.

Another object of the present invention is to provide a capacitive circuit capable of forming an equivalent capacitor which can be utilized as a coupling capacitor.

Another object of the present invention is to provide a capacitive circuit capable of forming an equivalent capacitor by which only lesser distortion of a signal occurs.

A capacitive circuit according to the present invention comprises: an input terminal for inputting an input signal; a high-pass type amplifier for receiving the input signal; a differential amplifier for detecting a differential component between an output signal of the high-pass type amplifier and the input signal; and a feed-back means for feeding-back the differential component to the input terminal.

By feeding-back the differential component to the input terminal, the input signal is phase-shifted by 90 degrees such that an input impedance of the circuit shows a capacitive characteristic, and therefore, an equivalent capacitor can be formed by the circuit. A capacitance value of the equivalent capacitor can be changed by changing a current which is supplied to the differential amplifier.

According to the present invention, an equivalent capacitor having a capacitance value larger than that obtained by utilizing a PN junction, and by changing the current supplied to the differential amplifier, it is possible to change the capacitance value of the equivalent capacitor within a wider range in comparison to the case where an equivalent capacitor is formed by the PN junction.

In one aspect of the present invention, one output of the differential amplifier is connected to the input terminal to feed-back the differential component thereto and the other output is connected to an output terminal of the circuit. In this aspect, the input signal is withdrawn from the output terminal with phase-shifted by 90 degrees, and therefore, an equivalent capacitor can be formed between the input terminal and the output terminal, and the capacitance value thereof can be changed by changing the current supplied to the differential amplifier.

In another embodiment, a capacitive circuit comprises: an input terminal for inputting an input signal; an output terminal for outputting an output signal; a first negative feed-back amplifier having an inverting input which is connected to the input terminal via a capacitor and a non-inverting input which is connected to the output terminal; a differential amplifier having a first input which is connected to the inverting input of the first negative feed-back amplifier through a first resistor and receives an output of the first negative feed-back amplifier and a second input which is connected to the output terminal; and a second negative feed-back amplifier having a non-inverting input which receives a signal according to an output of the differential amplifier through a load resistor and an inverting input which is connected to the output terminal through a second resistor, an output of the second negative feed-back amplifier being applied to the non-inverting input of the first negative feed-back amplifier.

According to the embodiment, the equivalent capacitor is formed between the input and output terminals, and a capacitance value thereof is dependent on a capacitance value of the capacitor and a resistance value of the first resistor.

In another embodiment, a common-emitter amplifier having a load indicative of a capacitive characteristic substantially is utilized for 90-degree phase shifting circuit. An amplification degree of the amplifier is defined by only an imaginary part. Therefore, an input signal is phase-shifted by 90 degrees and outputted from an output terminal.

In addition, in the above described embodiment, a negative feed-back path is formed between an output and an input of the amplifier, which feeds-back only a DC component included in the output of the amplifier to the input thereof such that a DC level of the output of the amplifier can be prevented from being changed.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
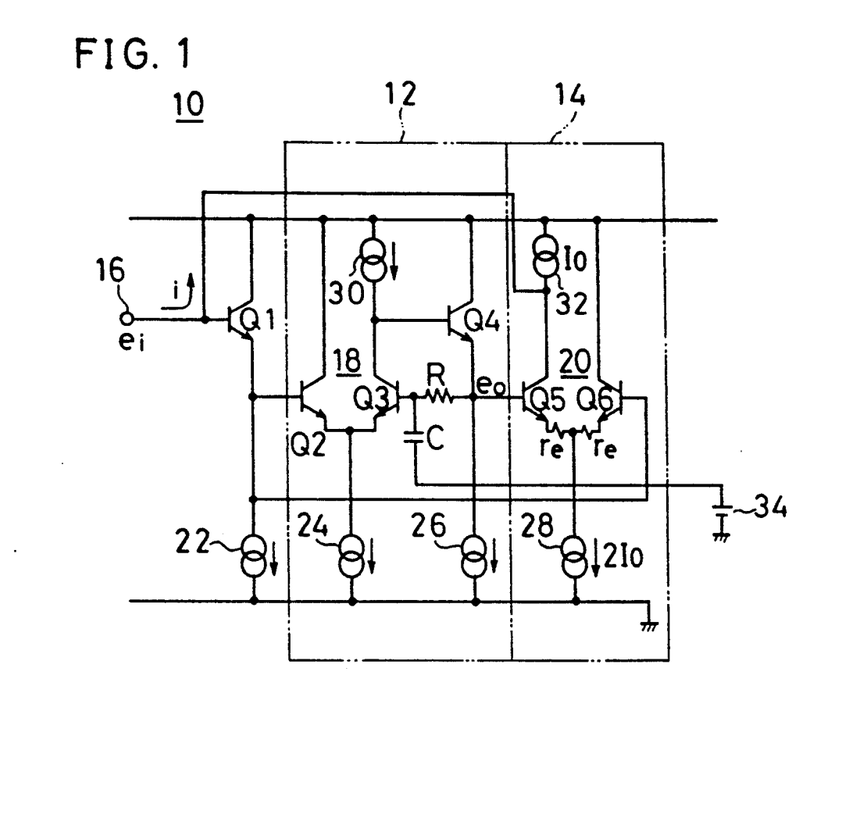
FIG. 1 is a circuit diagram showing one embodiment according to the present invention.

With reference to FIG. 1, a capacitive circuit 10 of this embodiment shown includes a high-pass type non-inverting amplifier 12 and a differential amplifier 14, and an input signal $e_i$ is given from an input terminal 16. The input signal $e_i$ is applied to a base of a transistor Q2 which is an input end of the non-inverting amplifier 12 through a transistor Q1 constituting an emitter-follower. The transistor Q2 constitutes a differential pair 18 together with a transistor Q3, and an output of the differential pair 18 is outputted to an emitter of a transistor Q4 from a collector of the transistor Q3. To the emitter of the transistor Q4, a series circuit of a resistor R and a capacitor C is connected. The output of the differential pair 18, that is, the emitter of the transistor Q4 is connected to a base of a transistor Q5 of the differential amplifier 14, and a base of a transistor Q6 which constitutes a differential pair 20 together with a transistor Q5 is connected to an emitter of the transistor Q1, that is, to the input end of the amplifier 12. An output of the differential pair 20 is outputted to a collector of the transistor Q5, and then fed-back via a feed-back path to a base of the transistor Q1, that is, the input terminal 16.

In addition, in the capacitive circuit 10 shown in FIG. 1, reference numerals 22, 24, 26, 28, 30 and 32 denote constant current sources (DC current sources), respectively, and a reference numeral 34 denotes a bias voltage source (DC voltage source).

In the capacitive circuit 10 of FIG. 1, an output signal $e_o$ of the non-inverting amplifier 12 which comes out at the emitter of the transistor Q4 is given by the following equation (1).

$$e_o = \left(1 + \frac{R}{1/j\omega C}\right)e_i = (1 + j\omega CR)e_i \quad (1)$$

The output signal $e_o$ of the non-inverting amplifier 12 is applied to one input of the differential pair 20 of the differential amplifier 14, and the other input of the differential pair 20 receives the input signal $e_i$. Therefore, a current i which flows-in from the input terminal 16 is given by the following equation (2) when a differential resister of each of the transistors Q5 and Q6 is $r_e$.

$$i = \frac{e_o - e_i}{2r_e} = \frac{1}{2r_e}\{(1 + j\omega CR)e_i - e_i\} \quad (2)$$
$$= \frac{j\omega CR}{2r_e} e_i$$

Then, on the assumption that $CR/2r_e = C_{eq}$, the equation (2) can be modified as follows:

$$i = e_i / \left(\frac{1}{j\omega C_{eq}}\right) \quad (3)$$

Therefore, a phase of the current i is advanced with respect to the input signal $e_i$ by 90 degrees, and therefore, a capacitive characteristic can be obtained.

A capacitance value of the equivalent capacitor $C_{eq}$ formed in the capacitive circuit 10 is given by the following equation (4).

$$C_{eq} = \frac{CR}{2r_e} = \frac{CR}{52} I_0 \quad (4)$$

$$\therefore r_e = \frac{26[mV]}{I_0[mA]}$$

Thus, the capacitance value of the equivalent capacitor $C_{eq}$ which is obtained by the capacitive circuit 10 shown in FIG. 1 is determined by the capacitor C, the resistor R and a bias current $I_0$ of the differential amplifier 14.

Therefore, in this embodiment shown in FIG. 1, by utilizing a variable constant current source 32 capable of changing the bias current $I_0$, it is possible to obtain a variable equivalent capacitance circuit. In addition, in this embodiment, as seen from the equation (4), it is possible to make the equivalent capacitor $C_{eq}$ large in proportion to the bias current $I_0$.

Figure 2:
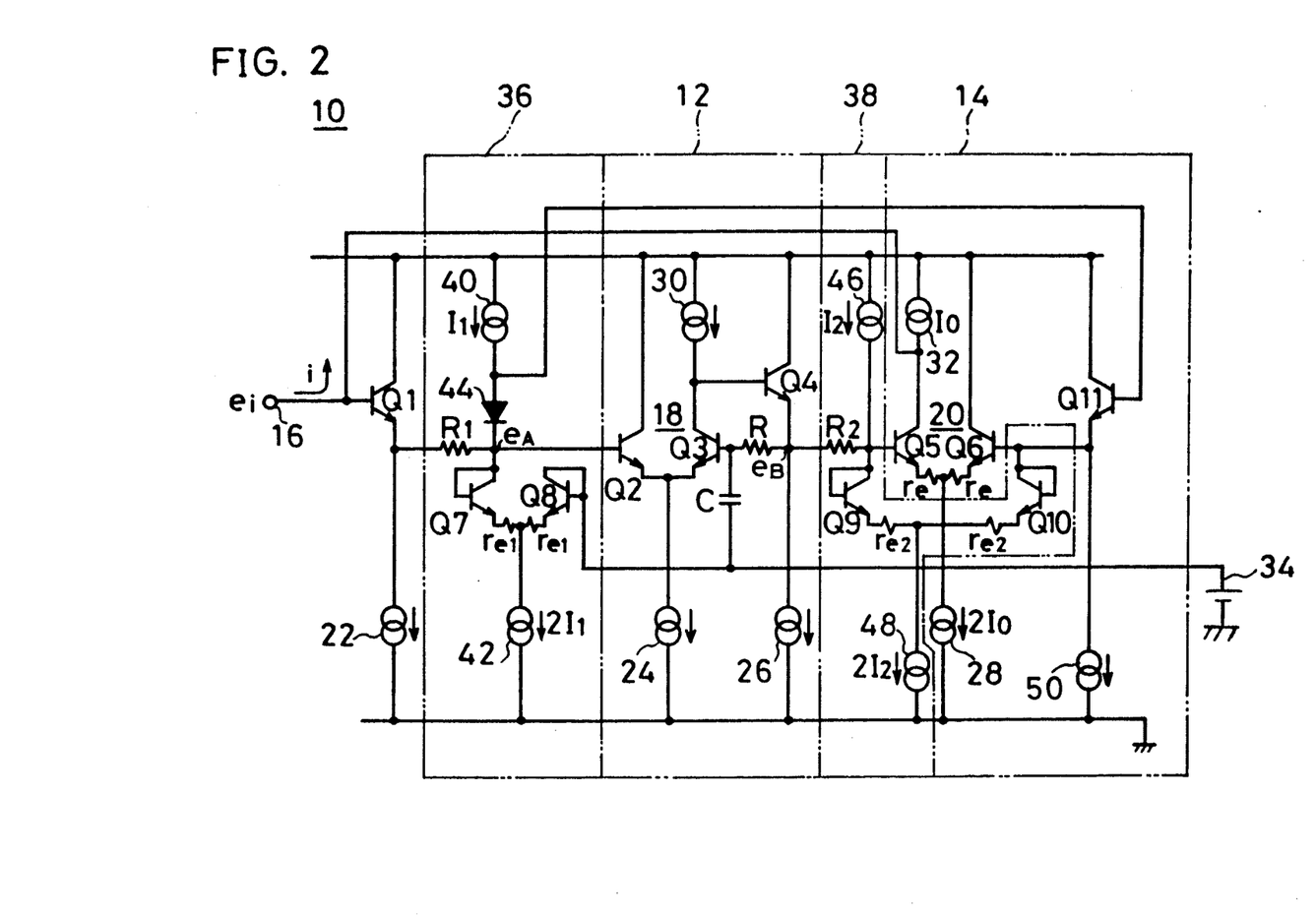
FIG. 2 is a circuit diagram showing a modified embodiment of FIG. 1 embodiment.

A capacitive circuit 10 shown in FIG. 2 includes attenuators 36 and 38 which are added to the non-inverting amplifier 12 and the differential amplifier 14 shown in FIG. 1, respectively. More specifically, the attenuator 36 includes transistors Q7 and Q8, and an input of the transistor Q7 is connected to an output of the transistor Q1 via a resistor $R_1$, and an input of the transistor Q8 is connected to the bias voltage source 34. Then, constant current sources 40 and 42 are utilized for the attenuation 36 in this embodiment, and a diode 44 is inserted between the constant current source 40 and a collector of the transistor Q7. The diode 44 and a transistor Q11 are utilized for adjusting of biases of the two attenuators 36 and 38. On the other hand, the attenuator 38 includes transistors Q9 and Q10, and an input of the transistor Q9 is connected to the output of the transistor Q4 via a resistor $R_2$, and an input of the transistor Q10 is connected to an emitter of the transistor Q11. Constant current sources 46 and 48 are utilized for the attenuator 38 in the embodiment. In addition, the base of the transistor Q6 of the differential pair 20 is also connected to the emitter of the transistor Q11, and a base of the transistor Q11 is fed-back to a point between the constant current source 40 and the diode 44. Furthermore, a constant current source 50 is inserted between the emitter of the transistor Q11 and the ground.

In the capacitive circuit 10 shown in FIG. 2, when the input signal $e_i$ is applied to the input terminal 16, the input signal $e_i$ is attenuated by the attenuator 36, and an output signal $e_A$ of the attenuator 36 is given by the following equation (5) on the assumption that a differential resistor of each of the transistors Q7 and Q8 is $r_{e1}$ and an attenuation factor of the attenuator 36 is $k_1$.

$$e_A = k_1 e_i, \quad k_1 = \frac{2r_{e1}}{R_1 + 2r_{e1}} \quad (5)$$

The output signal $e_A$ shown by the equation (5) is amplified by the non-inverting amplifier 12 as similar to the embodiment shown in FIG. 1, and therefore, an output signal $e_B$ of the non-inverting amplifier 12 is given by the following equation (6).

$$e_B = (1 + j\omega CR)e_A \quad (6)$$

In addition, a signal which is applied to a point between the bases of the transistors Q5 and Q6 is a signal obtained by attenuating a signal ($e_B - e_A$) by means of the attenuator 38, and therefore, the signal is given by the following equation (7) on the assumption that a differential resistor of each of the transistors Q9 and Q10 is $r_{e2}$ and an attenuation factor of the attenuator 38 is $k_2$.

$$k_2(e_B - e_A), \quad k_2 = \frac{2r_{e2}}{R_2 + 2r_{e2}} \tag{7}$$

Therefore, a current which flows-in from the input terminal 16 is given by the following equation (8) from the above described equation (5) through equation (7), and the equivalent capacitor $C_{eq}$ is given by the following equation (9).

$$\begin{aligned} i &= \frac{k_2(e_B - e_A)}{2r_e} = \frac{k_2 \cdot j\omega CR}{2r_e} e_A \\ &= \frac{k_1 \cdot k_2 \cdot j\omega CR}{2r_e} e_i \\ &= e_i \cdot \left( \frac{1}{j\omega \frac{k_1 \cdot k_2 CR}{2r_e}} \right)^{-1} \end{aligned} \tag{8}$$

$$C_{eq} = k_1 k_2 \frac{CR}{2r_e} \tag{9}$$

If $R_1 = R_2$ and $I_1 = I_2$, the equation (9) is modified as shown by the following equation (10) because $k_1 = k_2$.

$$C_{eq} = \left( \frac{2r_{e1}}{R_1 + 2r_{e1}} \right)^2 \cdot \frac{CR}{2r_e} \tag{10}$$

Then, if $R_1 >> 2r_{e1}$, $R_1 + 2r_{e1} \approx R_1$ is obtained, the equation (10) can be modified as shown by the following equation (11).

$$C_{eq} = \frac{2CR}{r_e R_1^2} \cdot r_{e1}^2 = \frac{2 \times 26^2 \times CR}{r_e R_1^2} \cdot \frac{1}{I_1^2} \tag{11}$$

$$\therefore r_{e1} = \frac{26(mV)}{I_1(mA)} \; [\Omega]$$

Thus, in the capacitive circuit 10 shown in FIG. 2, by controlling a bias current $I_1$ of the constant current source 40 for the attenuator 36, it is possible to obtain the equivalent capacitor $C_{eq}$ having a capacitance value which is in reverse-proportion to a square of the bias current $I_1$.

Figure 3:
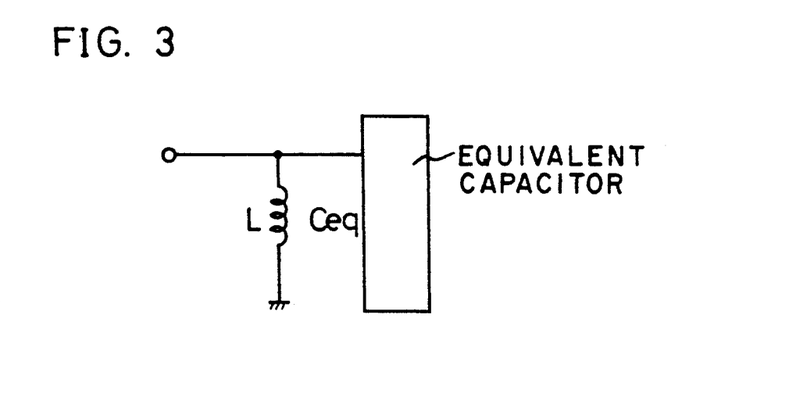
FIG. 3 is a circuit diagram showing an example in which FIG. 2 embodiment is utilized in an LC resonance circuit.

In a case where an LC resonance circuit shown in FIG. 3 is constructed by utilizing the embodiment shown in FIG. 2, since a resonance frequency $f_c$ of the LC resonance circuit is given by the following equation (12), it is possible to change the resonance frequency $f_c$ in a linear manner by adjusting the bias current $I_1$.

$$f_c = \frac{1}{2\pi \sqrt{LC_{eq}}} \tag{12}$$

Figure 4:
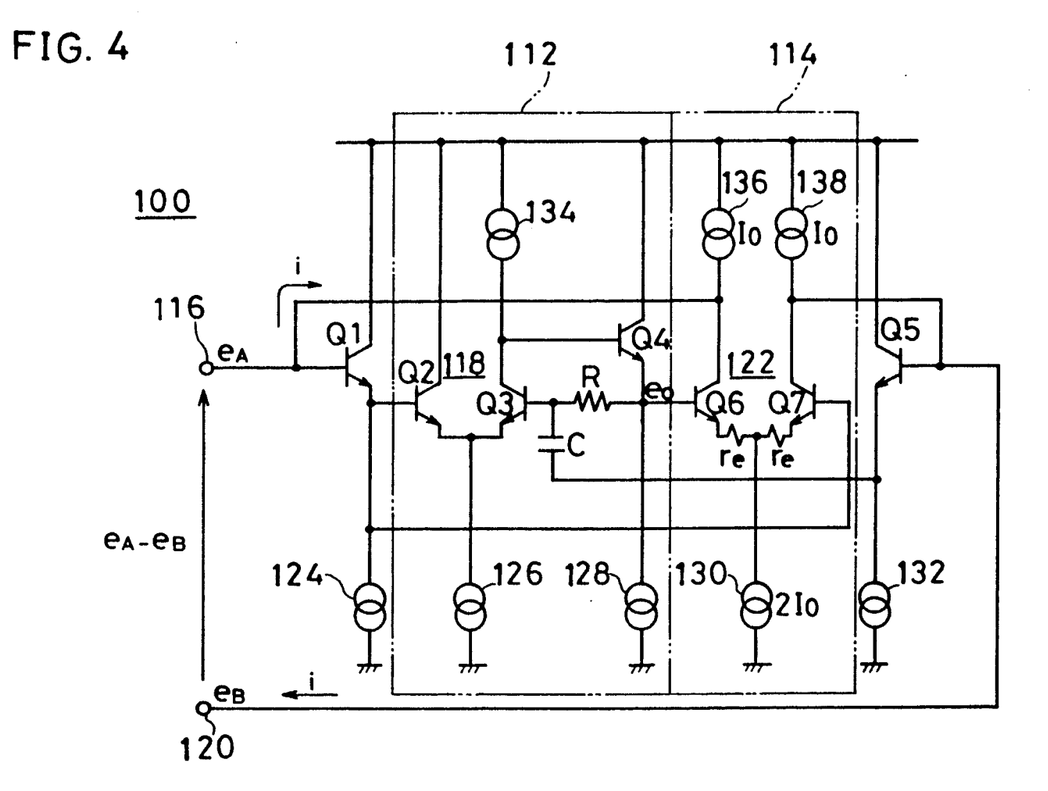
FIG. 4 is a circuit diagram showing another embodiment according to the present invention.

With reference to FIG. 4, a capacitive circuit 100 of this embodiment shown includes a high-pass type non-inverting amplifier 112 and a differential amplifier 114, and an input signal $e_A$ is given from an input terminal 116. The input signal $e_A$ is applied to a base of a transistor Q2 which is a non-inverting input of the high-pass type amplifier 112 through a transistor Q1 constituting an emitter-follower. The transistor Q2 constitutes a differential pair 118 together with a transistor Q3, and an output of the differential pair 118 is outputted to an emitter of a transistor Q4 from a collector of the transistor Q3. To the emitter of the transistor Q4, a series circuit of a resistor R and a capacitor C is connected. To a base of the transistor Q3, an output signal $e_B$ from an output terminal 120 is inputted through a transistor Q5 constituting an emitter-follower and the capacitor C. Then, the output of the differential pair 118, that is, the emitter of the transistor Q4 is connected to a base of a transistor Q6 of the differential amplifier 114, and a base of a transistor Q7 which constitutes a differential pair 122 together with the transistor Q6 is connected to an output of the transistor Q1. An output of the transistor Q6 is connected to a base of the transistor Q1, that is, the input terminal 116, and an output of the transistor Q7 is connected to the output terminal 120.

In addition, in the capacitive circuit 100 shown in FIG. 4, reference numerals 124, 126, 128, 130, 132, 134, 136 and 138 denote constant current sources (DC current sources), respectively.

In the capacitive circuit 100 of FIG. 4, an output signal $e_o$ of the non-inverting amplifier 112 which comes out at the emitter of the transistor Q4 is given by the following equation (13).

$$e_o = (1 + j\omega CR)e_A - j\omega CRe_B \tag{13}$$

The output signal $e_o$ of the non-inverting amplifier 112 is applied to one input of the differential pair 122 of the differential amplifier 114, and the other input of the differential pair 122 receives the input signal $e_A$. Therefore, a current i which flows-in from the input terminal 116 and then flows-out from the output terminal 120 is given by the following equation (14) when a differential resistor of each of the transistors Q6 and Q7 is $r_e$.

$$i = \frac{e_o - e_A}{2r_e} \tag{14}$$

Then, $r_e$ is equal to 26 mV/$I_0$ mA, that is, $r_e = 26$ mV/$I_0$ mA is obtained. Therefore, if the equation (14) is substituted with the equation (13), the following equation (15) can be obtained.

$$i = \frac{j\omega C}{2r_e}(e_A - e_B) \tag{15}$$

In addition, on the assumption that $CR/2r_e = C_{eq}$, the equation (15) can be modified as follows:

$$i = j\omega C_{eq}(e_A - e_B) = (e_A - e_B) / \left( \frac{1}{j\omega C_{eq}} \right) \tag{16}$$

Therefore, a capacitive characteristic can be obtained between the input terminal 116 and the output terminal 120, and accordingly, an equivalent capacitor $C_{eq}$ in the capacitive circuit 100 is given by the following equation (17).

$$C_{eq} = \frac{CR}{52} I_0 \tag{17}$$

Thus, a capacitance value of the equivalent capacitor $C_{eq}$ which is obtained by the capacitive circuit 100 shown in FIG. 4 is determined by the capacitor C, the resistor R and a bias current $I_0$. Therefore, in this embodiment shown in FIG. 4, by utilizing a variable constant current source 136 or 138 capable of changing the bias current $I_0$, it is possible to obtain a variable equivalent capacitance circuit.

In addition, in this embodiment, the capacitance value of the equivalent capacitor $C_{eq}$ is in proportion to the bias current $I_0$. For example, assuming that $C=30$ pF, $R=100$ k$\Omega$, $I_0=0.1$ mA, the capacitance value of the equivalent capacitance $C_{eq}$ becomes 5800 pF approximately.

Figure 5:
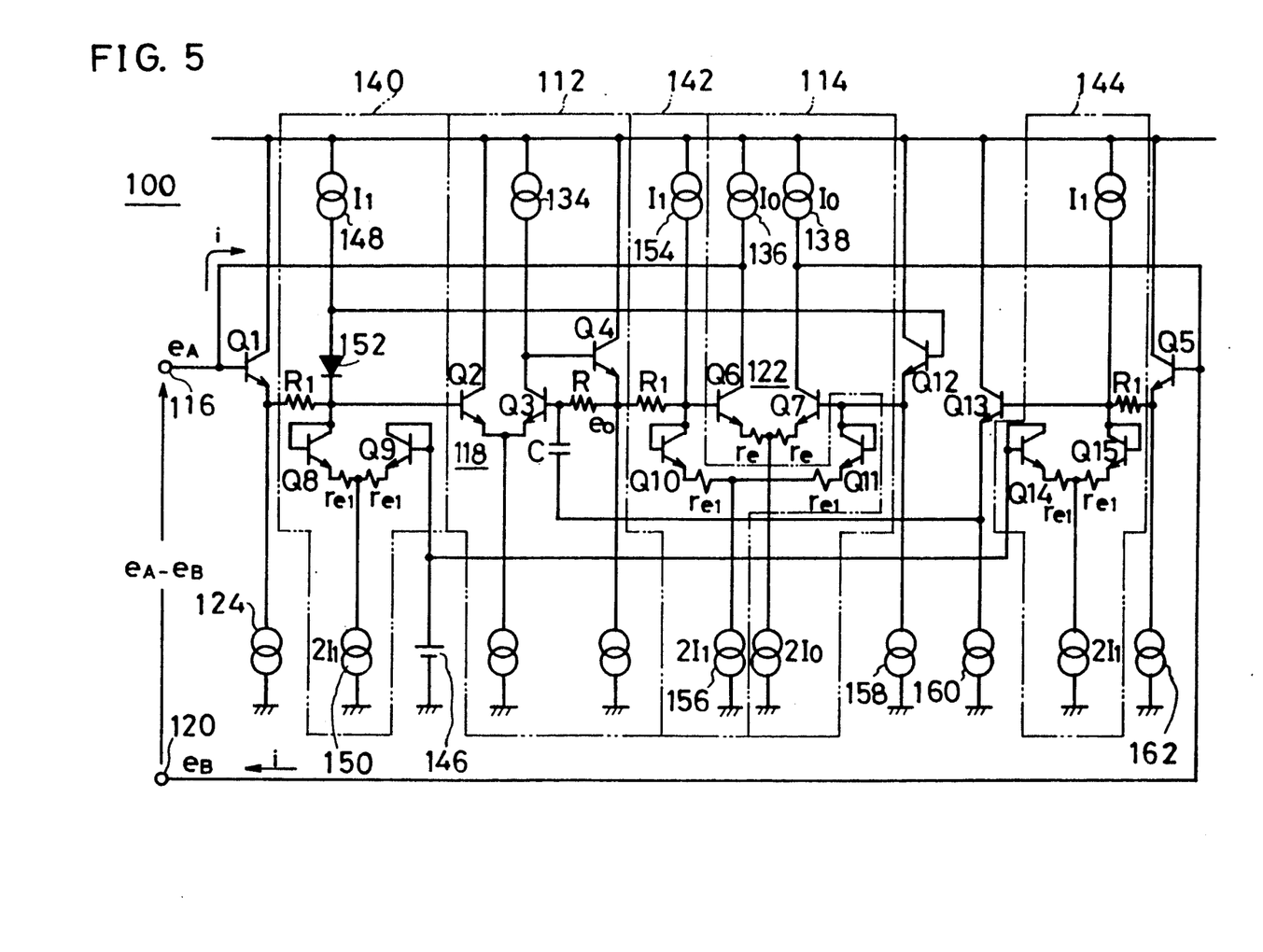
FIG. 5 is a circuit diagram showing a modified embodiment of FIG. 4 embodiment.

A capacitive circuit 100 shown in FIG. 5 includes attenuators 140, 142 and 144 are added to the FIG. 4 embodiment. More specifically, the attenuator 140 includes transistors Q8 and Q9, and an input of the transistor Q8 is connected to the output of the transistor Q1 via a resistor $R_1$, and an input of the transistor Q9 is connected to a bias voltage source 146. At each of emitters of the transistors Q8 and Q9, a differential resistor $r_{el}$ is formed. Then, constant current sources 148 and 150 are utilized for the attenuator 140 in this embodiment, and a diode 152 is inserted between the constant current source 148 and a collector of the transistor Q8. In addition, the attenuator 142 includes transistors Q10 and Q11, and an input of the transistor Q10 is connected to the output of the transistor Q4 via a resistor $R_1$, and an input of the transistor Q11 is connected to an emitter of the transistor Q12. At each of emitters of the transistors Q10 and Q11, a differential resistor $r_{el}$ is formed. Constant current sources 154 and 156 are utilized for the attenuator 142 in the embodiment. In addition, the base of the transistor Q7 is connected to the emitter of the transistor Q12, and a base of the transistor Q12 is fed-back to a point between the constant current source 148 and the diode 152. Furthermore, the attenuator 144 includes transistors Q14 and Q15, and an input of the transistor Q15 is connected to the emitter of the transistor Q5 via a resistor $R_1$. A differential resistor $r_{el}$ is formed at each of emitters of the transistors Q14 and Q15. In FIG. 5, reference numerals 158, 160 and 162 denote constant current sources, respectively.

Similar to the FIG. 4 embodiment, in the capacitive circuit 100 shown in FIG. 5, the output signal $e_o$ from the transistor Q4 of the high-pass type amplifier 112 is given by the following equation (18) on the assumption that an attenuator factor of each of the attenuator 140, 142 and 144 is k although a detailed description of the development is omitted here.

$$e_o = k(1 + j\omega CR)e_A - j\omega CR \cdot ke_B \quad (18)$$

$$k = \frac{2r_{el}}{R_1 + 2r_{el}},$$

$$\therefore r_{el}[\Omega] = \frac{26[\text{mV}]}{I_1[\text{mA}]}$$

Therefore, since a signal of $k(e_o - ke_A)$ is applied between the bases of the transistors Q6 and Q7, the current which flows-in from the input terminal 116 is given by the following equation (19), and the equivalent capacitor $C_{eq}$ is given by the following equations (20).

$$i = \frac{k(e_o - ke_A)}{2r_e} = j\omega \frac{k^2 CR}{2r_e}(e_A - e_B) \quad (19)$$

-continued $$C_{eq} = \frac{k^2 CR}{2r_e} = \frac{CR}{52} I_0 \cdot k^2 \quad (20)$$

$$= \frac{CR}{52} I_0 \cdot \left(\frac{2r_{el}}{R_1 + 2r_{el}}\right)^2$$

If it is assumed that $R_1 > 2r_e$, the following equation (21) is also obtained.

$$C_{eq} \approx \frac{CR}{52} I_0 \cdot \frac{4r_{el}^2}{R_1^2} \quad (21)$$

$$= \frac{52CR}{R_1^2} \cdot I_0 \cdot I_1^{-2}$$

Thus, in the capacitive circuit 100 shown in FIG. 5, by controlling the bias current $I_0$ or $I_1$, it is possible to change the capacitance value of the equivalent capacitor $C_{eq}$ in a manner that it is changed to be in proportion to the bias current $I_0$ or in reverse-proportion to a square of the bias current $I_1$.

Figure 6:
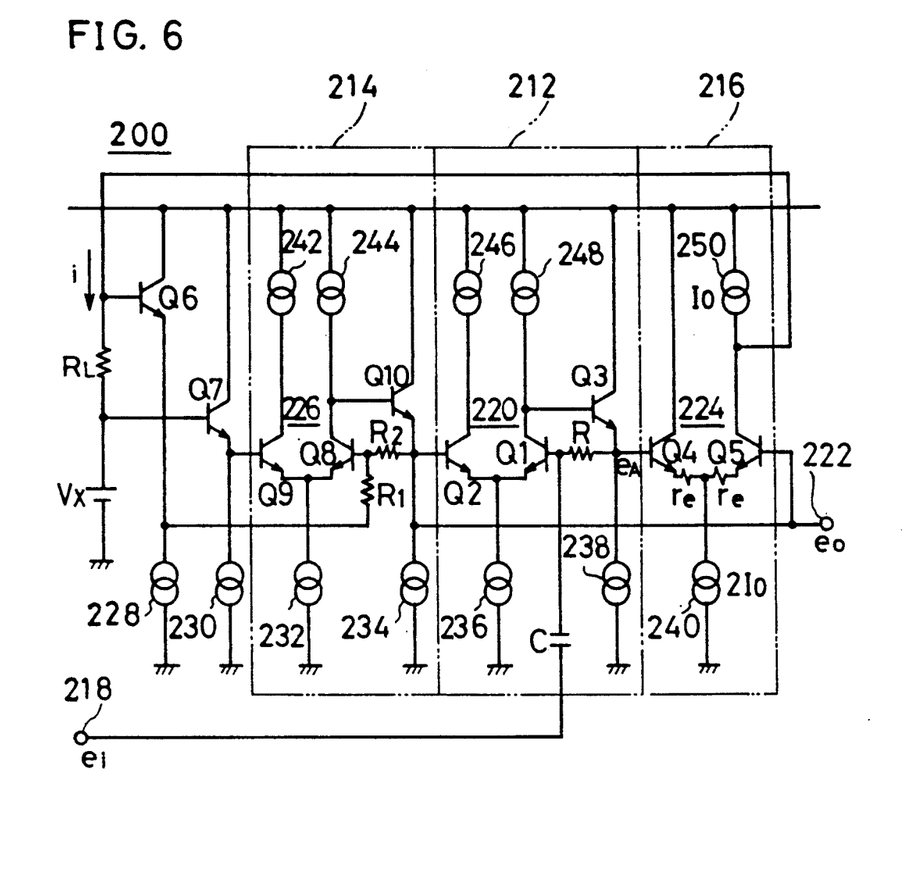
FIG. 6 is a circuit diagram showing another embodiment according to the present invention.

With reference to FIG. 6, a capacitive circuit 200 of this embodiment shown includes negative feed-back amplifiers 212 and 214, and a differential amplifier 216, and an input signal $e_i$ is given from an input terminal 218. The input signal $e_i$ is applied to a base of a transistor Q1 which is an inverting input of the negative feed-back amplifier 212 through a capacitor C. The transistor Q1 constitutes a differential pair 220 together with a transistor Q2, and a base of the transistor Q2 becomes a non-inverting input thereof of the negative feed-back amplifier 212, and an output signal $e_o$ which is outputted at an output terminal 222 is inputted to the transistor Q2. An output of the differential pair 220 is outputted as a signal $e_A$ through the transistors Q1 and Q3. A feed-back resistor R is inserted between the base of the transistor Q1 and an emitter of the transistor Q3.

Therefore, the signal $e_A$ is applied to a base of a transistor Q4 which becomes one input of the differential amplifier 216 via the feed-back resistor R, and a base of a transistor Q5 which becomes the other input of the differential amplifier 216 is connected to the output terminal 222. The transistor Q5 constitutes a differential pair 224 together with the transistor Q4. At each of emitters of the transistors Q4 and Q5, a differential resistor $r_e$ is formed.

Then, an output current from the collector of the transistor Q5 flows to a bias voltage source Vx via a load resistor RL, and then fed-back to the base of the transistor Q6. The base of the transistor Q7 is connected to the bias voltage source Vx. An output of the transistor Q6 is inputted to a base of a transistor Q8 which is an inverting input of the negative feed-back amplifier 214 via a resistor $R_1$. An output of the transistor Q7 is applied to a base of a transistor Q9 which constitutes a differential pair 226 together with a transistor Q8, that is, to a non-inverting input of the negative feed-back amplifier 214. An output of the differential pair 226, i.e. the negative feed-back amplifier 214 is outputted at an emitter of a transistor Q10 from a collector of the transistor Q8, and a feed-back resistor $R_2$ is connected between the emitter of the transistor Q10 and the base of the transistor Q8. In addition, the emitter of the transistor Q10 is connected to the ground.

In addition, in the capacitive circuit 200 shown in FIG. 6, reference numerals 228, 130, 232, 234, 236, 238, 240, 242, 244, 246, 248 and 250 denote constant current sources (DC current sources), respectively, and a constant current $2I_0$ flows in the constant current source 240 and a constant current $I_0$ flows in the constant current source 250. As described above, the reference symbol Vx denotes the bias voltage source (DC voltage source).

In the capacitive circuit 200 of FIG. 6, since the input signal $e_i$ is inputted to the base of the transistor Q1 through the capacitor C and an output signal $e_o$ is inputted to the base of the transistor Q2, the signal which comes out at the emitter of the transistor Q3 is given by the following equation (22).

$$e_A = \left(1 + R/\left(\frac{1}{j\omega C}\right)\right)e_o - \frac{R/1}{j\omega C}e_i \quad (22)$$
$$= (1 + j\omega CR)e_o - j\omega CRe_i$$

Then, the signal $e_A$ is inputted to the base of the transistor Q4, and the output signal $e_o$ is inputted to the base of the transistor Q5. A differential signal according to the signal $e_A$ and the output signal $e_o$ is outputted from the collector of the transistor Q5, and then fed-back to the base of the transistor Q6. At this time, a current flowing in the load resistor $R_L$ is given by the following equation (23).

$$i = \frac{(e_A - ke_o)}{2r_e} = \frac{j\omega CR(e_o - e_i)}{2r_e} \quad (23)$$

The base signal of the transistor Q6 is the input signal of the negative feed-back amplifier 214 and a signal which comes out at the emitter of the transistor Q10 is the above described output signal $e_o$, and therefore, if $R_1 = R_2$, the base signal of the transistor Q6 can be represented by $-e_o$. Therefore, the current i can be represented by the following equation (24).

$$i = \frac{-e_o}{R_L} \quad (24)$$

Therefore, a result shown by the following equation (25) can be obtained by the equations (23) and (24).

$$\frac{-e_o}{R_L} = \frac{j\omega CR(e_o - e_i)}{2r_e} \quad (25)$$

$$\left(j\omega \frac{C}{2r_e} + \frac{1}{R_L}\right)e_o = j\omega \frac{CR}{2r_e} \cdot e_i$$

$$\therefore \frac{e_o}{e_i} = R_L / \left(R_L + \left(\frac{1}{j\omega CR/2r_e}\right)\right)$$

Figure 7:
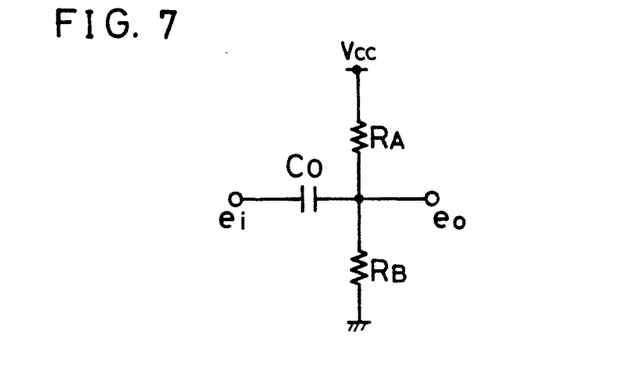
FIG. 7 is a circuit diagram showing an equivalent capacitive circuit.

A transfer characteristic of a capacitive circuit shown in FIG. 7 can be represented by the following equation (26).

$$\frac{e_o}{e_i} = R_o / \left(R_o + \frac{1}{j\omega C_o}\right) \quad (26)$$

$$R_o = \frac{R_A R_B}{R_A + R_B}$$

If the result shown by the equation (25) is compared with the equation (26), the both become coincident with each other. Therefore, the output signal $e_o$ from the capacitive circuit 200 indicates a capacitive characteristic equivalently.

In addition, a capacitance value of an equivalent capacitance $C_{eq}$ thus obtained can be given by the following equation (27).

$$C_{eq} = \frac{CR}{2r_e} = \frac{CR}{52} I_0 \quad (27)$$

$$\left[\because r_e = \frac{26(\text{mV})}{I_0(\text{mA})}\right]$$

In the equation (27), values of the capacitor C and the resistor R are fixed. Therefore, if the $I_0$ is set such that $(RI_0/52) > 1$ is obtained in the equation (27), it is possible to make the equivalent capacitor $C_{eq}$ larger than the capacitor C, and by increasing the current $I_0$, capacitance value of the the equivalent capacitor $C_{eq}$ can be increased in proportion to the current $I_0$. Accordingly, since the equivalent capacitor $C_{eq}$ can be set at a desired value by controlling the current $I_0$, it is possible to incorporate an equivalent capacitor having a relatively large capacitance in an integrated circuit.

Figure 8:
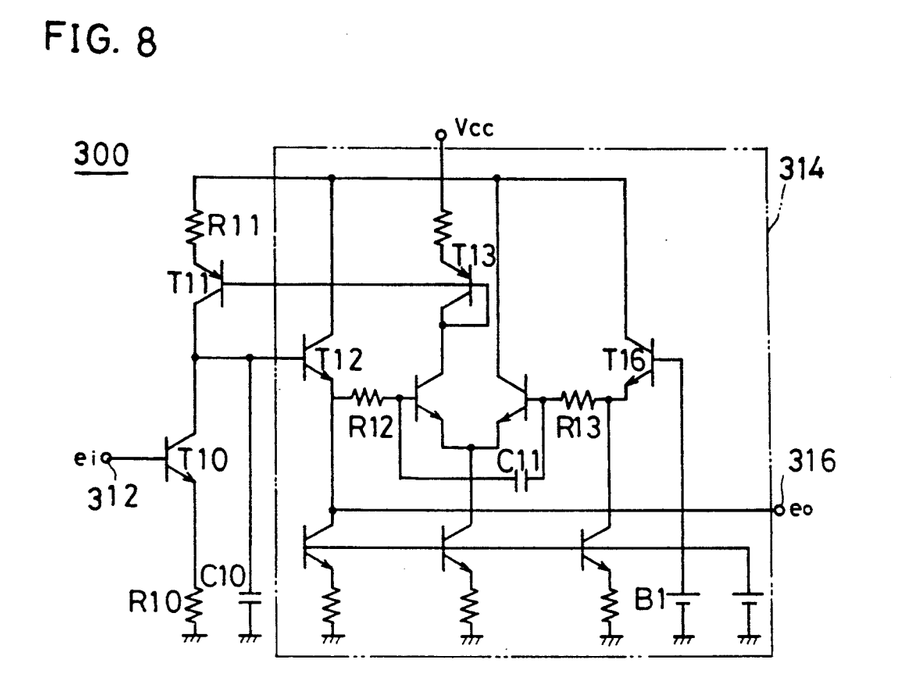
FIG. 8 is a circuit diagram showing another embodiment according to the present invention.

With reference to FIG. 8, a capacitive circuit 300 of this embodiment shown includes an input terminal 312 to which an input signal $e_i$ is applied. The input terminal 312 is connected to a base of a transistor T10 which constitutes a common-emitter type amplifier, and an emitter of the transistor T10 is connected to a resistor R10. A collector of the transistor T10 is connected to a collector of a transistor T11 and a capacitor C10. An emitter of the transistor T11 is connected to a resistor R11.

In order to suppress a fluctuation of a DC level at an output, a DC voltage suppression circuit 314 is provided. The DC voltage suppression circuit 314 suppresses an AC component of the output which comes out at the collector of the transistor T11 and negatively feedsback only a DC component to the transistor T10. More specifically, the collector of the transistor T10 is connected to a base of transistor T12, and a base of the transistor T11 is connected to a base of a transistor T13. The transistor T11 is utilized as a current source for the transistor T10. The output obtained at the collector of the transistor T10 is withdrawn from an emitter of the transistor T12 as an output signal $e_o$. On the other hand, an AC component of an output signal which comes out at an emitter of the transistor T12 is suppressed by the resistor R12, capacitor C11 and resistor R13, and therefore, only the DC component is supplied to a base of a transistor T14. Therefore, a voltage corresponding to a base voltage of a transistor T15 comes out at a collector of the transistor T14, and a current flows in the transistor T14, and therefore, a voltage drop due to the current is supplied to the base of the transistor T11. Accordingly, the emitter of the transistor T10 becomes coincident in potential with an emitter of a transistor T16, and thus, the DC level of the output at the collector of the transistor T10 is made stable by a constant voltage source B1.

In the capacitive circuit 300 shown in FIG. 8, the transistor T10 constitutes a common-emitter amplifier, and an amplification degree A thereof is represented by the following equation (28).

$$A = \frac{1/j\omega C_{10}}{R_{10}} \quad (28)$$

Therefore, the output of the collector of the transistor T10 becomes $1/j\omega \cdot C_{10} \cdot R_{10}$, only an imaginary part remains. Then, the output is withdrawn from an output terminal 316 as the output signal $e_o$ through the emitter of the transistor T12, and the output signal $e_o$ can be represented by the following equation (29).

$$e_o = e_i \frac{1}{j\omega C_{10} \cdot R_{10}} \quad (29)$$

Thus, the output signal $e_o$ becomes equal to that an imaginary part is multiplied by the input signal $e_i$, and therefore, the output signal $e_o$ is phase-shifted with respect to the input signal $e_i$ by 90 degrees.

Figure 9:
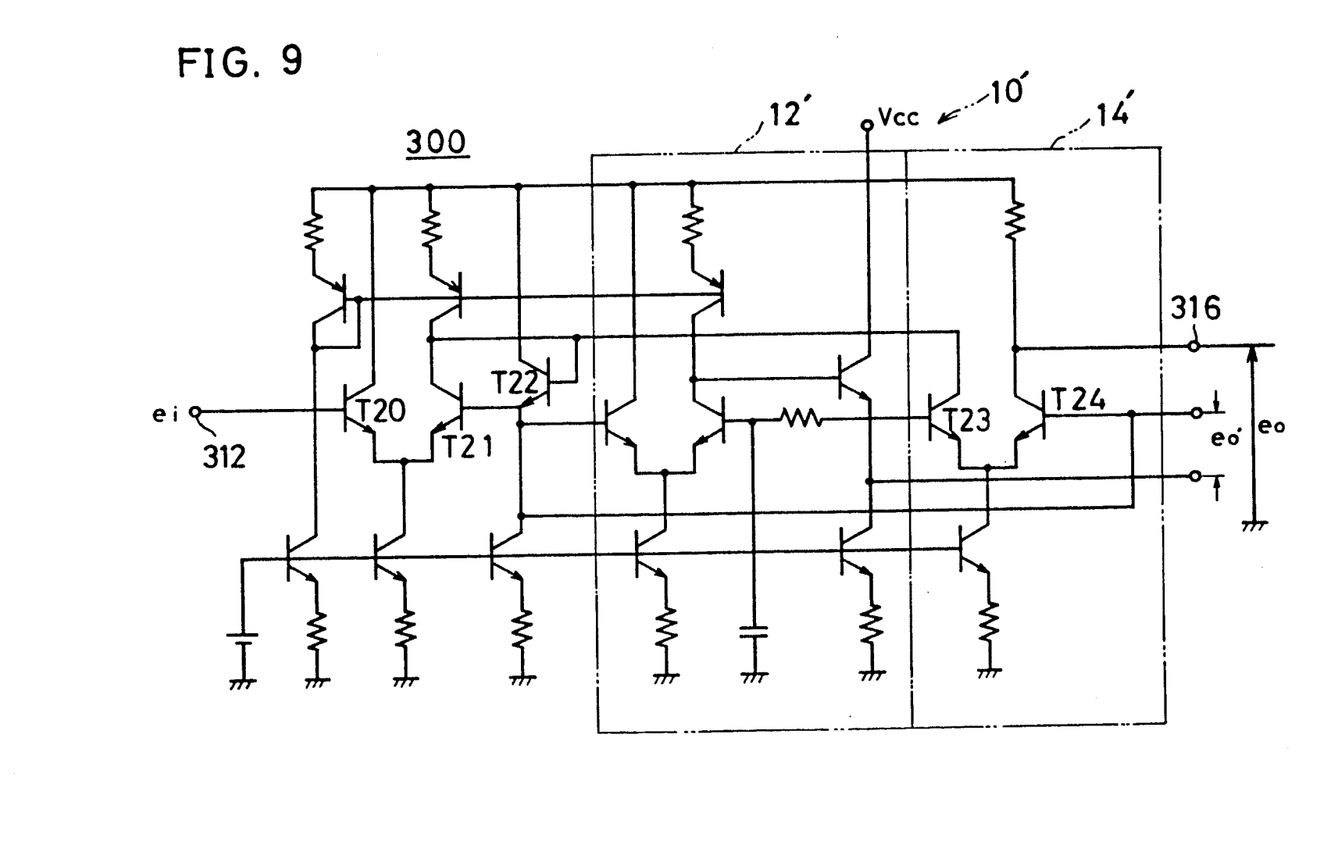
FIG. 9 is a circuit diagram showing a modified embodiment of FIG. 8 embodiment.
Figure 10:
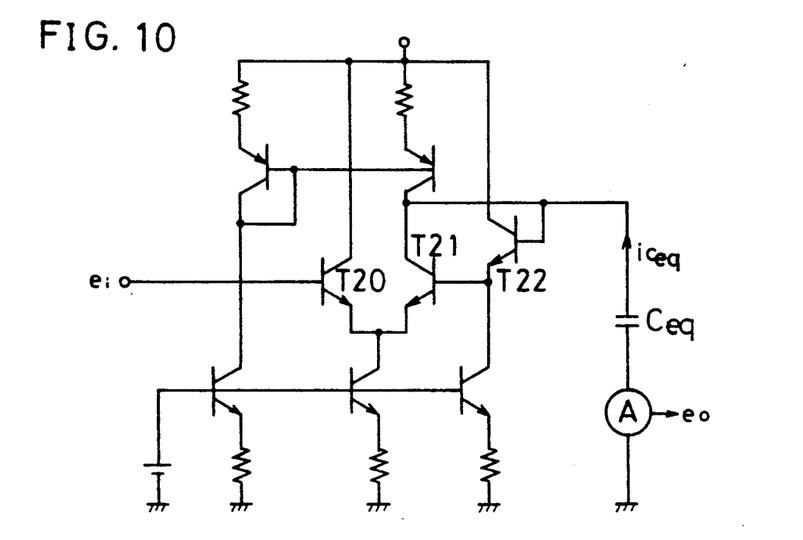
FIG. 10 is an equivalent circuit diagram of FIG. 9 embodiment.

In addition, the capacitor $C_{10}$ may be replaced with the equivalent capacitor $C_{eq}$ shown in FIG. 1, for example. An embodiment of this case is shown in FIG. 9. Therefore, FIG. 9 can be modified as shown in FIG. 10 by using the equivalent capacitor $C_{eq}$. In FIG. 10 embodiment, a differential pair composed of transistors T20 and T21 constitutes a feed-back amplifier in which a signal equivalent to the input signal $e_i$ is outputted to bases of the transistors T20 and T21, and therefore, a current $i_{ceq}$ flowing the equivalent capacitor $C_{eq}$ is given by the following equation (30).

$$iC_{eq} = j\omega \, C_{eq} \, e_i \quad (30)$$

Then, $j\omega \, C_{eq}$ is only an imaginary part, and therefore, the current $i_{ceq}$ is shifted by 90 degrees with respect to the input signal $e_i$. Accordingly, the output signal $e_o$ can be withdrawn from a path of the current $i_{ceq}$. By the FIG. 9 embodiment, it is possible to omit the capacitor $C_{11}$ of FIG. 8 embodiment, and therefore, there is an advantage that a capacitor having a large capacitance value is not needed to be incorporated an integrated circuit.

In addition, each of the above described capacitive circuits can be incorporated in an integrated circuit for processing a video signal and/or an audio signal. Such an integrated circuit is used in a video signal reproducing apparatus such as a television receiver, video tape recorder, camcorder, video disc player, and etc. and an audio signal reproducing apparatus such as a radio receiver, tape recorder, audio disc player, and etc. Especially, the embodiment shown in FIG. 4 or FIG. 5, or the embodiment shown in FIG. 6 is suitable for a coupling capacitor, and the embodiment shown in FIG. 8 or FIG. 9 is suitable for a phase-shifting circuit for shifting a phase of a signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A capacitive circuit, comprising:
   an input terminal for inputting an input signal;
   a high-pass type amplifier for receiving said input signal;
   a differential amplifier for detecting a differential component between an output signal of said high-pass type amplifier and said input signal; and
   feed-back means for feeding-back said differential component to said input terminal, whereby said input signal is phase-shifted by 90 degrees.

2. A capacitive circuit according to claim 1, further comprising a first attenuator for attenuating a signal inputted to said high-pass type amplifier; and a second attenuator for attenuating a signal inputted to said differential amplifier.

3. A capacitive circuit according to claim 1 or 2, wherein said differential amplifier includes two outputs, and one output of said differential amplifier is connected to said input terminal and the other output of said differential amplifier is connected to an output terminal of the circuit.

4. A capacitive circuit, comprising:
   an input terminal for inputting an input signal;
   an output terminal for outputting an output signal;
   a first negative feed-back amplifier having an inverting input which is connected to said input terminal via a capacitor and a non-inverting input which is connected to said output terminal;
   a differential amplifier having a first input which is connected to said inverting input of said first negative feed-back amplifier through a first resistor and receives an output of said first negative feed-back amplifier and a second input which is connected to said output terminal; and
   a second negative feed-back amplifier having a non-inverting input which receives an input according to an output of said differential amplifier through a load resistor and an inverting input which is connected to said output terminal through a second resistor, an output of said second negative feed-back amplifier being applied to said non-inverting input of said first negative feed-back amplifier.

5. In a video signal reproducing apparatus which includes an integrated circuit for processing a video signal, said integrated circuit comprising an improved capacitive circuit, the improvement comprising:
   an input terminal for inputting an input signal;
   a high-pass type amplifier for receiving said input signal;
   a differential amplifier for detecting a differential component between an output signal of said high-pass type amplifier and said input signal; and
   feed-back means for feeding-back said differential component to said input terminal, whereby said input signal is phase-shifted by 90 degrees.

6. In an audio signal reproducing apparatus which includes an integrated circuit for processing an audio signal, said integrated circuit comprising an improved capacitive circuit the improvement comprising:
   an input terminal for inputting an input signal;
   a high-pass type amplifier for receiving said input signal;
   a differential amplifier for detecting a differential component between an output signal of said high-pass type amplifier and said input signal; and
   feed-back means for feeding-back said differential component to said input terminal, whereby said input signal is phase-shifted by 90 degrees.

7. In a video signal reproducing apparatus which includes an integrated circuit for processing a video signal, said integrated circuit comprising an improved capacitive circuit the improvement comprising:

an input terminal for inputting an input signal;

an output terminal for outputting an output signal;

a first negative feed-back amplifier having an inverting input which is connected to said input terminal via a capacitor and a non-inverting input which is connected to said output terminal;

a differential amplifier having a first input which is connected to said inverting input of said first negative feed-back amplifier through a first resistor, said first input receiving an output of said first negative feed-back amplifier, and a second input which is connected to said output terminal; and a second negative feed-back amplifier having a non-inverting input which receives an input according to an output of said differential amplifier through a load resistor and an inverting input which is connected to said output terminal through a second resistor, an output of said second negative feed-back amplifier being applied to said non-inverting input of said first negative feed-back amplifier.

8. In an audio signal reproducing apparatus which includes an integrated circuit for processing an audio signal, said integrated circuit comprising an improved capacitive circuit the improvement comprising:

an input terminal for inputting an input signal;

an output terminal for outputting an output signal;

a first negative feed-back amplifier having an inverting input which is connected to said input terminal via a capacitor and a non-inverting input which is connected to said output terminal;

a differential amplifier having a first input which is connected to said inverting input of said first negative feed-back amplifier through a first resistor and said first input receiving an output of said first negative feed-back amplifier, and a second input which is connected to said output terminal; and a second negative feed-back amplifier having a non-inverting input which receives an input according to an output of said differential amplifier through a load resistor and an inverting input which is connected to said output terminal through a second resistor, an output of said second negative feed-back amplifier being applied to said non-inverting input of said first negative feed-back amplifier.

9. A video signal reproducing apparatus including an integrated circuit for processing a video signal, said integrated circuit comprising the capacitive circuit of claim 1.

10. An audio signal reproducing apparatus including an integrated circuit for processing an audio signal, said integrated circuit comprising the capacitive circuit of claim 1.

11. A video signal reproducing apparatus, including an integrated circuit for processing a video signal, said integrated circuit comprising the capacitive circuit of claim 4.

12. An audio signal reproducing apparatus, including an integrated circuit for processing an audio signal, said integrated circuit comprising the capacitive circuit of claim 4.

* * * * *